United States Patent
Wickeraad

(10) Patent No.: US 10,622,071 B2
(45) Date of Patent: Apr. 14, 2020

(54) CONTENT ADDRESSABLE MEMORY

(71) Applicant: Hewlett Packard Enterprise Development LP, Houston, TX (US)

(72) Inventor: John A. Wickeraad, Granite Bay, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/757,355

(22) PCT Filed: Sep. 4, 2015

(86) PCT No.: PCT/US2015/048555
§ 371 (c)(1),
(2) Date: Mar. 3, 2018

(87) PCT Pub. No.: WO2017/039687
PCT Pub. Date: Mar. 9, 2017

(65) Prior Publication Data
US 2018/0240521 A1    Aug. 23, 2018

(51) Int. Cl.
*G11C 15/04*    (2006.01)
*G11C 15/00*    (2006.01)

(52) U.S. Cl.
CPC ............. *G11C 15/04* (2013.01); *G11C 15/00* (2013.01); *Y02D 10/13* (2018.01)

(58) Field of Classification Search
CPC ... G11C 15/00; G11C 15/04; G06F 17/30982; Y02D 10/13
See application file for complete search history.

(56) References Cited

U.S. PATENT DOCUMENTS

| | | | | |
|---|---|---|---|---|
| 5,930,359 | A * | 7/1999 | Kempke | G06F 16/90339 713/160 |
| 6,731,526 | B2 * | 5/2004 | Inoue | G11C 15/04 365/168 |
| 6,763,426 | B1 * | 7/2004 | James | G11C 15/00 365/49.17 |

(Continued)

OTHER PUBLICATIONS

International Searching Authority, The International Search Report and the Written Opinion, dated Jun. 3, 2016, PCT/US2015/048555, 14 Pgs.

(Continued)

*Primary Examiner* — Vanthu T Nguyen
(74) *Attorney, Agent, or Firm* — Hewlett Packard Enterprise Patent Department

(57) ABSTRACT

Examples disclosed herein relate, in one aspect, to a method for searching an array of content addressable memory (CAM) devices, where each device stores a plurality of entries. The method may obtain a search key from a processor, search a first set of CAM devices in the array to determine whether the first set of CAM devices include a matching entry corresponding to the search key; upon a determination that the first set of CAM devices does not include the matching entry, search a second set of CAM devices in the array to determine whether the second set of CAM devices include the matching entry; and upon a determination that the first set of CAM devices include the matching entry, output an address of the matching entry, without searching the second set of CAM devices.

15 Claims, 4 Drawing Sheets

(56) References Cited

U.S. PATENT DOCUMENTS

| | | | |
|---|---|---|---|
| 6,775,166 B2* | 8/2004 | McKenzie | G11C 15/00 365/189.07 |
| 6,862,655 B1 | 3/2005 | Podaima et al. | |
| 6,965,519 B1* | 11/2005 | Park | G11C 15/00 365/189.07 |
| 6,967,856 B1 | 11/2005 | Park et al. | |
| 7,346,731 B2* | 3/2008 | Narayanaswamy | G11C 15/00 711/108 |
| 7,355,872 B2* | 4/2008 | Hsu | G11C 15/04 365/189.08 |
| 7,739,445 B1 | 6/2010 | Venkatachary | |
| 7,774,538 B2 | 8/2010 | Hong et al. | |
| 8,156,309 B2* | 4/2012 | Steiss | G06F 12/1036 711/207 |
| 8,638,583 B2 | 1/2014 | Watanabe et al. | |
| 9,025,354 B2 | 5/2015 | Channabasappa | |
| 9,583,190 B2* | 2/2017 | Miller | G11C 15/00 |
| 2009/0141530 A1 | 6/2009 | Arsovski et al. | |
| 2013/0242632 A1 | 9/2013 | Wada | |
| 2015/0039823 A1 | 2/2015 | Chen | |

OTHER PUBLICATIONS

Pagiamtzis, K. et al, A Low-power Content-addressable Memory (CAM) Using Pipelined Hierarchical Search Scheme, Sep. 2004, 8 Pgs.

\* cited by examiner

CONTENT ADDRESSABLE MEMORY

BACKGROUND

A content addressable memory (CAM) is a useful device for executing table lookup operations. Particularly, because of the parallel lookup capability, a device can execute thousands or even millions of comparisons with one lookup operation that may in some cases take no more than a single clock cycle.

BRIEF DESCRIPTION OF THE DRAWINGS

The following detailed description references the drawings, wherein.

DETAILED DESCRIPTION

Figure 1:
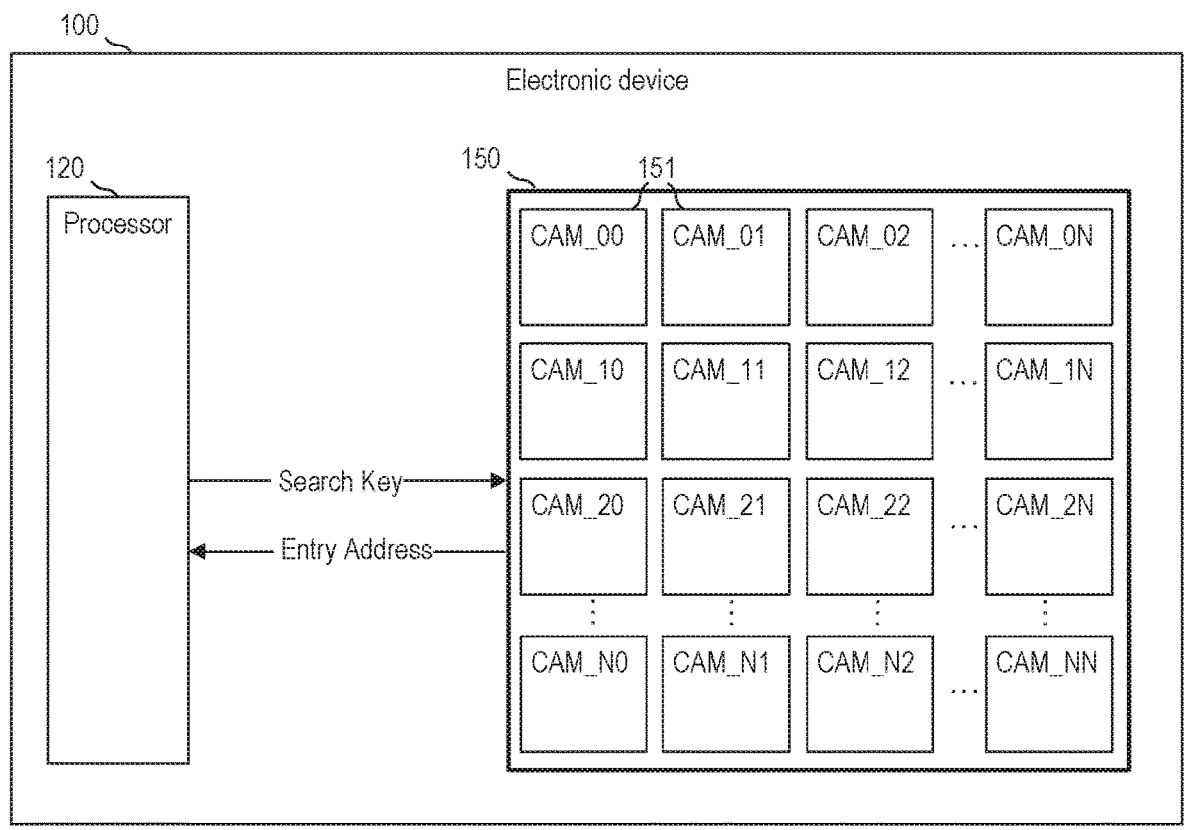
FIG. 1 is a block diagram of an example electronic device.

For computer systems, a CAM is widely used as the address lookup table for cache memory (called cache TAG), or as the paging translation look-aside buffer (TLB). For communication applications, a CAM is used to support address lookup operations for routers. Recently, the rapid growth of networking systems has triggered demand for high density and high speed CAM devices. CAM devices may include binary CAM (BCAM) devices that can only store "0" and "1" bits, and ternary CAM (TCAM) devices that can also store "don't-care" or "X" bits. Accordingly, a BCAM may store fully specified data, such as fully specified IP addresses, while a TCAM may store fully specified data as well as partially masked data, such as data specifying a sub-network (e.g., 192.168.20.16122) corresponding to multiple IP addresses.

Performing a lookup operation (or "searching") a CAM may include providing a search key to the CAM, and obtaining from the CAM an address of an entry that corresponds to the search key, such as an entry whose non-"X" bits are either equal to corresponding bits in the search key, or are masked off by a global search mask that can also be provided to the CAM. Searching a CAM may sometimes be a low-latency (e.g., one-cycle long) operation, but the operation may consume large amounts of power, especially if a large CAM (i.e., a CAM storing large amounts of data) is being searched.

As will be discussed below, a CAM may be implemented as a two-dimensional array of CAM devices, where each CAM device may be a standalone, independently searchable device. Some examples described herein provide systems and methods for searching a CAM by incrementally and selectively searching an array of CAM devices included in the CAM, and stopping the search once a matching entry is found. As a result, some CAM devices in the array may be excluded from the search, which may reduce the power consumption and heat generation of a search operation, which in turn may improve other system parameters, such as cost, complexity, performance, etc.

Examples discussed herein describe, among other things, a memory array that includes a plurality of content addressable memory (CAM) devices arranged in a plurality of rows, each row of CAM devices storing a plurality of row-wide entries. The memory array may obtain a search key, search the plurality of rows, row by row, for a matching row-wide entry corresponding to the search key; and upon finding the matching row-wide entry, output an address of the matching row-wide entry and stop searching the plurality of rows. Searching a row in the plurality of rows may include searching all CAM devices in the row in parallel and determining whether all CAM devices in the row collectively store the matching row-wide entry. Alternatively, searching a row in the plurality of rows may include enabling CAM devices in the row one by one, determining for each enabled CAM device whether the enabled CAM device comprises at least a portion of the matching row-wide entry, and upon a determination that the enabled CAM device does not comprise at least a portion of the matching row-wide entry, stopping searching the row.

Examples discussed herein further describe a memory array that includes a plurality of content addressable memory (CAM) devices arranged in a plurality of rows, each CAM device storing a plurality of device-wide entries. The memory array may obtain a search key; search the plurality of rows, row by row, for a matching device-wide entry corresponding to the search key; and upon finding the matching device-wide entry, output an address of the matching device-wide entry and stop searching the plurality of rows. Searching a row in the plurality of rows may include searching all CAM devices in the row in parallel and determining whether at least one CAM device in the row stores the matching device-wide entry. Alternatively, searching a row in the plurality of rows may include enabling CAM devices in the row one by one, determining for each enabled CAM device whether the enabled CAM device comprises the matching device-wide entry, and upon a determination that the enabled CAM device comprises the matching entry, stopping searching the row.

FIG. 1 is a block diagram of an example electronic device 100. Electronic device 100 may include any type of an electronic device or a combination of electronic devices. For example, electronic device 100 may include a network device (e.g., a network switch, a network router, etc.), a server, a desktop computer, a notebook computer, a tablet computer, a mobile phone, a smartphone, a gaming device, a printing device, and so forth.

Electronic device 100 may include a processor 120. Processor 120 may include one or multiple processors, such as central processing units (CPUs), semiconductor-based microprocessors, hardware state machines, graphics processing units (GPUs), field-programmable gate arrays (FPGAs), or other electronic circuitry, which may be integrated in a single device or distributed across devices. In some examples, processor 120 may also be implemented as a combination of hardware and programming, as will be further discussed below.

Electronic device 100 may also include a content addressable memory (CAM) 150 communicatively coupled to processor 120. CAM 150 and processor 120 may be located on the same physical device or on separate physical devices, e.g., if electronic device 100 is implemented as a number of interconnected physical devices. CAM 150 may include any type of content addressable memory, such as a ternary content addressable memory (TCAM), a binary content addressable memory (BCAM), or any other type of memory capable of storing data entries, receiving from processor 120 a search key, finding an entry matching the search key, and returning to processor 120 the entry's address within the memory. In some examples, instead or in addition to returning to processor 120 the entry's address, CAM 150 may return to processor 120 a value stored at the entry's address in another memory communicatively coupled to CAM 150.

As illustrated in FIG. 1, in some examples, CAM 150 may be implemented as a two-dimensional array of CAM devices 151. That is, CAM 150 may include a plurality of CAM devices 151 that may be arranged, for example, in a plurality of rows and a plurality of columns. For example, as illustrated in FIG. 1, CAM devices 151 indicated as CAM_00, CAM_01, CAM_02, . . . CAM_0N may be referred to as devices in the first row (also referred to as row CAM_0X), and CAM devices 151 indicated as CAM_00, CAM_10, CAM_20, . . . CAM_X0 may be referred to as devices in the first column (also referred to as column CAM_X0). It is appreciated, however, that the terms "row" and "column" are relative and that each of these terms may be used to describe a set of CAM devices 151 arranged in any direction. For example, any of the sets of devices CAM_XN, CAM_NX, CAM_X0, or CAM_0X, may be considered as the first row, the first column, the last row, or the last column.

In some examples, each CAM device 151 may include a standalone CAM (e.g., BCAM or TCAM) device, that is, a device that is not an integral component of another memory device, and that may be enabled (e.g., powered on, configured, etc.) and searched independently of other CAM devices 151. That is, each CAM device 151 may obtain a search key (and optionally a search mask), determine whether it stores an entry corresponding to the search key, and if so, output that entry's address. In some examples, each CAM device 151 may include a plurality of entries and may perform a search operation in one clock cycle. Thus, in some examples discussed herein, one clock cycle is used to describe the search latency of an individual CAM device 151. These examples are not limiting, however, as it is appreciated that the methods and systems described herein are also applicable to CAM devices 151 having longer latency periods.

Figure 2:
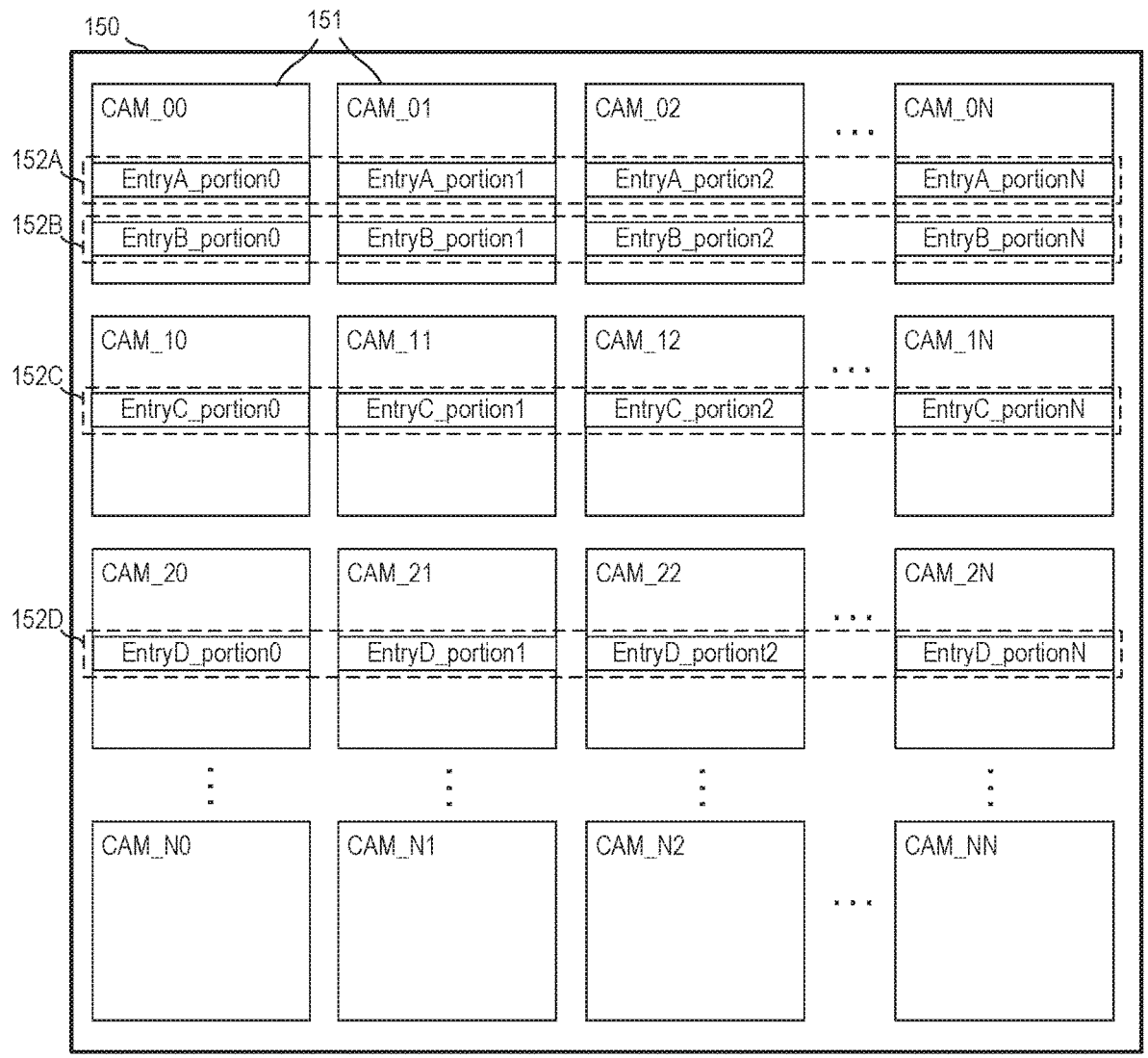
FIG. 2 is a block diagram of an example content addressable memory.
Figure 3:
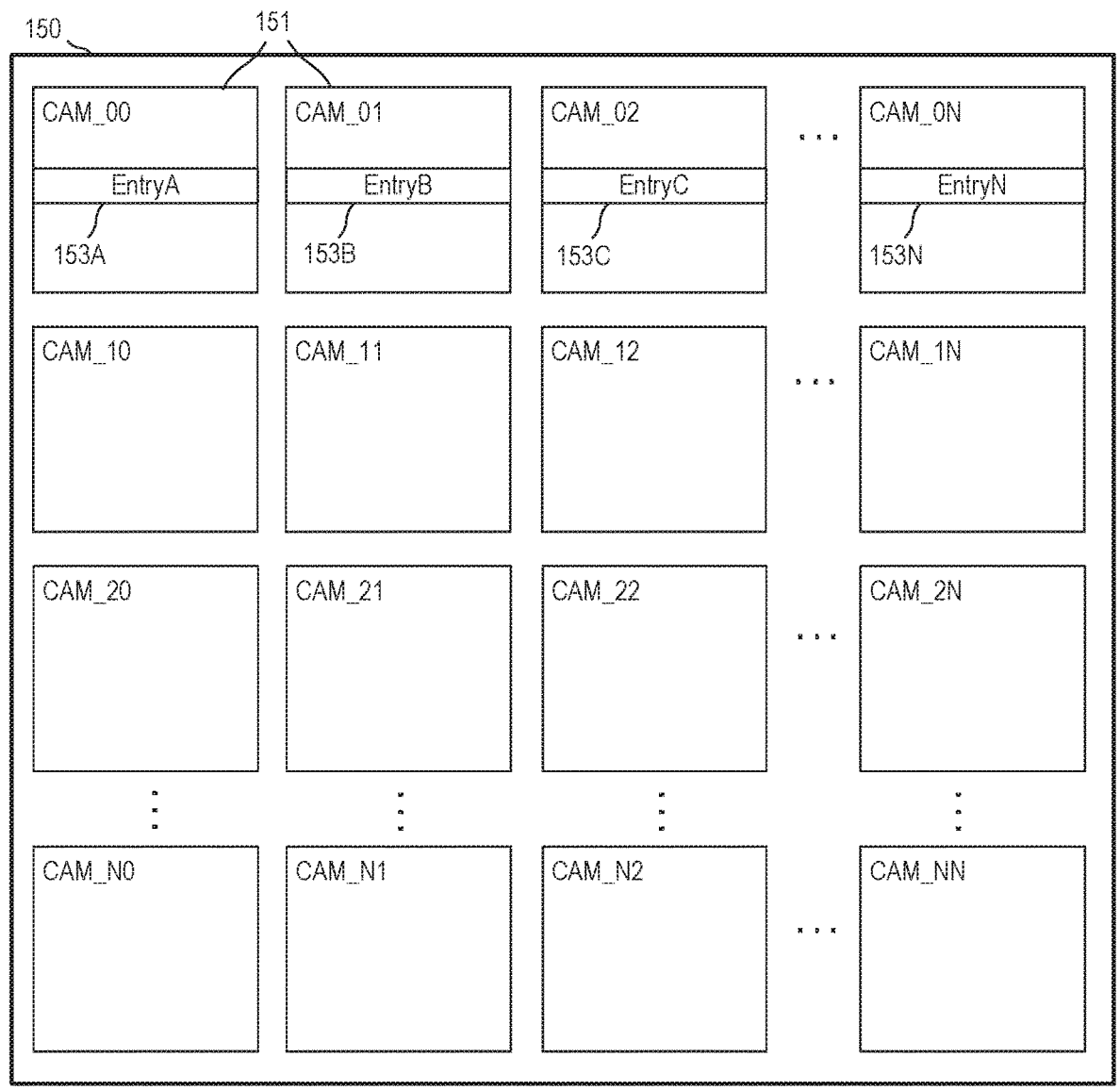
FIG. 3 is another block diagram of an example content addressable memory.

In some examples, each entry stored in CAM device 151 may either be a device-wide entry (i.e., an entry that does not span multiple CAM devices 151) or a row-wide entry (i.e., an entry that spans an entire row of CAM devices 151, such that each CAM device in that row stores a different portion of the entry). For example, FIG. 2, illustrates an example CAM 150 storing a plurality of row-wide entries 152, such as entries 152A, 152B, 152C, and 152D, and FIG. 3 illustrates an example CAM 150 storing a plurality of device-wide entries 153, such as entries 153A, 153B, 153C, and 153D, In some examples, CAM 150 may store row-wide entries only or device-wide entries only, while in other examples, CAM 150 may store both types of entries, as well as any additional types of entries. Accordingly, the search key obtained by CAM 150 may be either a row-wide search key or a device-wide search key, where the device-wide search key may in some examples be implemented as a row-wide search key combined with a search mask that masks off some portions of the search key.

In some examples, upon obtaining a search key (e.g., from processor 120), CAM 150 may search the plurality of rows of CAM devices 151 in a row-by-row fashion until a matching entry, i.e., an entry corresponding to the search key, is found. CAM 150 may search the rows of CAM devices 151 one by one, in accordance with a predefined order. The predefined order may be a sequential order, e.g., from a first row (e.g., CAM_0X) to a last row (e.g., CAM_NX), or vice versa, or any other type of sequential or non-sequential order. In some examples (e.g., if CAM 150 is a TCAM) each row of CAM devices 151 and the entries stored therein may be associated with a different priority, and CAM 150 may search the rows in a decreasing order of priority, such that higher-priority rows are searched before lower-priority rows. For example, the first row of CAM devices 151 (e.g., CAM_0X) may store higher-priority entries than the second row of CAM devices 151 (e.g., CAM_1X), and so on, in which case CAM 150 may first search the first row, then the second row, and so on.

In some examples, upon determining that a particular row stores a matching entry (e.g., row-wide entry 152 or device-wide entry 153), CAM 150 may stop the search and output the address of the matching entry without searching additional rows. For example, if CAM 150 is searching the rows sequentially, starting from row CAM_0X, and determines that row CAM_0X does not store a matching entry, CAM 150 may proceed to searching the second row (CAM_1X). If CAM 150 then determines that the second row stores a matching entry, it may stop the search and output the address of the matching entry (e.g., to processor 120) without searching the remaining rows CAM_2X to CAM_NX, As a result, the average per-search power consumption of CAM 150 may be significantly reduced.

In some examples, to search a particular row of CAM devices 151, CAM 150 may search all CAM devices 151 in the row in parallel (e.g., during the same clock cycle). For example, if a particular row stores row-wide entries and CAM 150 obtained a row-wide search key, CAM 150 may search all CAM devices 151 in that row in parallel, and determine whether all CAM devices 151 in the row collectively store a row-wide entry corresponding to the row-wide search key (every CAM device 151 storing a different portion of the row-wide entry). Similarly, if a particular row stores device-wide entries and CAM 150 obtained an entry-wide search key, CAM 150 may search all CAM devices 151 in that row in parallel, and determine (e.g., in one clock cycle) whether at least one CAM device 151 in that row stores a device-wide entry corresponding to the device-wide search key.

In other examples, to search a particular row of CAM devices 151, CAM 150 may search that row incrementally, i.e., one CAM device 151 at a time, (e.g., one CAM device 151 per clock cycle). CAM device 151 may search the CAM devices 151 in the row in accordance with a predefined order, which may be a sequential order (e.g., from the first column to the last column or vice versa) or any other sequential or non-sequential order.

In some examples, if CAM 150 incrementally searches a row of CAM devices 151 storing row-wide entries, CAM 150 may stop searching the row upon determining that CAM device 151 being searched does not store a portion of a row-wide entry corresponding to the row-wide search key. For example, if CAM 150 is searching a second row (CAM_1X) incrementally (e.g., sequentially, starting from CAM_10), and determines that CAM_10 stores a corresponding portion of the row-wide entry, it may proceed to searching CAM_11. If CAM 150 then determines that CAM_11 does not store a corresponding portion (or that the portion is not stored at the same address as the portion in CAM_10), CAM 150 may stop searching the second row and may proceed to the third row (CAM_2X) without searching the remaining devices in the second row (CAM_12, . . . CAM_1N). While such an incremental intra-row search may increase the search latency compared to the parallel search of a row described above, it may significantly reduce the amount of power consumed by a search operation, on average.

To further increase power savings, in some examples, each column of CAM 150 may be associated with a "mismatch likelihood," a statistical likelihood that a portion of a row-wide entry stored in CAM device 151 in that column will not match the corresponding portion of the row-wide search key. In these examples, CAM 150 may incrementally search CAM devices 151 in each row in accordance with a decreasing order of mismatch likelihood, that is, search CAM devices 151 located at columns associated with higher mismatch likelihoods before searching CAM devices 151 located at columns associated with lower mismatch likelihoods. As a result, CAM 150 may more quickly determine that the row does not store a matching row-wide entry and more CAM devices 151 may be excluded from the search, on average.

In some examples, CAM 150 may obtain a plurality of search keys, and simultaneously search for a plurality of matching entries corresponding to the plurality of search keys. For example, if CAM 150 searches each row incrementally, CAM 150 may start performing the next search as soon as the previous search has progressed by one CAM device 151. That is, after CAM_00 has been searched for a matching entry (e.g., device-wide entry or a portion of a row-wide entry) corresponding to a first search key, CAM_00 may be searched for a matching entry corresponding to a second search key. As another example, if CAM 150 searches all CAM devices 151 in a row in parallel, CAM 150 may start performing the next search as soon as the previous search has progressed by one row of CAM devices 151. That is, after all CAM devices 151 in row CAM_0X have been searched for a matching entry corresponding to a first search key, the devices may be searched for a matching entry corresponding to a second search key. Thus, for example, if it takes one clock cycle to search an individual CAM device 151 (in an incremental search) or to search an entire row of CAM devices 151 in parallel, CAM 150 may start a new search every clock cycle, and output search results (e.g., addresses of matching entries) every clock cycle. Accordingly, in some examples, significant power savings may be achieved without affecting the overall throughput of search operations of CAM 150.

In some examples, instead of searching the plurality of rows in a row-by-row fashion, CAM 150 may incrementally search a number of rows in parallel. For example, CAM 150 may start incrementally searching the first row (CAM_0X); one clock cycle later, start incrementally searching the second row (CAM_1X); another clock cycle later, start incrementally searching the third row (CAM_10). In these examples, too, CAM 150 may stop searching a particular row once it encounters a CAM device 151 not storing a matching portion of a row-wide entry, and may stop searching the entire array when it encounters a CAM device 151 that stores a matching device-wide entry or when it encounters a row of CAM devices 151 collectively storing a matching row-wide entry. In these examples, too, CAM 150 may start a new search operation and output a search result every clock cycle.

Figure 4:
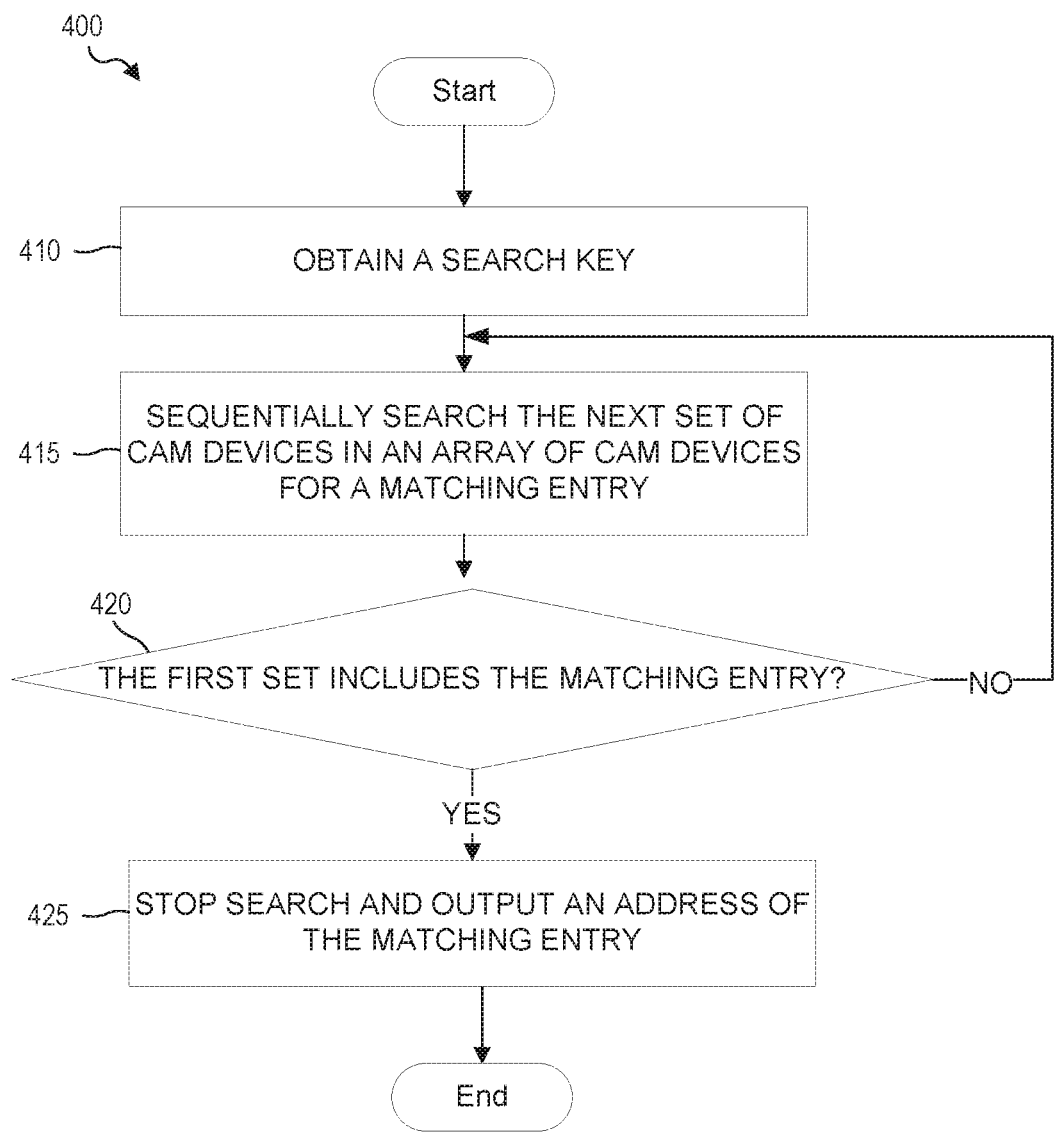
FIG. 4 is a flowchart of an example method for searching a content addressable memory.

FIG. 4 is a flowchart of an example method 400 for searching an array of content addressable memory (e.g., CAM 150). Method 400 may be described below as being executed or performed by a one or more modules of an electronic device, such as by CAM 150 and/or processor 120 of electronic device 100. Other suitable systems and/or electronic devices may be used as well. Method 400 may be implemented in the form of executable instructions stored on at least one non-transitory machine-readable storage medium of the electronic device and executed by at least one processor (e.g., 120) of the electronic device. Alternatively or in addition, method 400 may be implemented in the form of electronic circuitry (e.g., hardware). In alternate examples of the present disclosure, one or more or blocks of method 400 may be executed substantially concurrently or in a different order than shown in FIG. 4. In alternate examples of the present disclosure, method 400 may include more or less blocks than are shown in FIG. 4. In some examples, one or more of the blocks of method 400 may, at certain times, be ongoing and/or may repeat.

At block 410, method 400 may obtain from a search key (e.g., a row-wide or a device-wide search key) from a processor (e.g., 120). At block 415, the method may sequentially search a first set of CAM devices in the array (e.g., a first row of CAM devices 151 in CAM 150). As discussed above, sequentially searching the first set of CAM devices may include searching the first set of CAM devices in a decreasing order of a mismatch likelihood associated with each CAM device in the first set of CAM devices. At block 420, the method may determine whether the first set of CAM devices include a matching entry corresponding to the search key.

Upon a determination that the first set of CAM devices does not include the matching entry, the method may proceed to block 415 again where it may sequentially search a second set of CAM devices in the array (e.g., a second row of CAM devices 151) to determine whether the second set of CAM devices include the matching entry. As discussed above, in some examples, each CAM device in the array may be a ternary content addressable memory (TCAM) device, in which case the first set of CAM devices may be associated with a first priority and the second set of CAM devices may be associated with a second priority, lower than the first priority.

It is appreciated that the method may similarly proceed to search all sets of CAM devices in the array until it determines that no set includes the matching entry or until it finds a set that includes the matching entry. Upon finding a set that includes the matching entry, the method may proceed to block 425 where the method may output an address of the matching entry. The method may then end without searching any remaining sets of CAM devices in the array.

As discussed above, in some examples the method may also include obtaining a second search key from the processor and searching the first set of CAM devices to determine whether the first set of CAM devices include a second matching entry corresponding to the second search key, while searching the first set of CAM devices to determine whether the first set of CAM devices include the matching entry corresponding to the search key.

What is claimed is:

1. A memory array comprising a plurality of content addressable memory (CAM) devices arranged in a plurality of rows, each row of CAM devices storing a plurality of row-wide entries, wherein the memory array is to:
    obtain a search key;
    search the plurality of rows, row by row, for a matching row-wide entry corresponding to the search key; and
    upon finding the matching row-wide entry, output an address of the matching row-wide entry and stop searching the plurality of rows;
    wherein while searching a row in the plurality of rows, the method further comprises:
        enabling CAM devices in the row one by one in a decreasing order of a mismatch likelihood associated with each CAM device;
        determining for each enabled CAM device whether the enabled CAM device comprises at least a portion of the matching row-wide entry; and upon a determination that the enabled CAM device does not comprise at least a portion of the matching row-wide entry, stopping searching the row.

2. The memory array of claim 1, wherein each CAM device in the memory array comprises a ternary content addressable memory (TCAM), wherein the plurality of rows are associated with a plurality of priorities, and wherein the memory array is to search plurality of rows in a decreasing order of priority.

3. The memory array of claim 1, wherein enabling CAM devices in the row one by one comprises enabling CAM devices in the row in a decreasing order of a mismatch likelihood associated with each CAM device.

4. The memory array of claim 1, wherein the memory array is further to obtain a second search key and to search the plurality of rows for a second matching row-wide entry corresponding to the second search key while searching the plurality of rows for the matching row-wide entry.

5. The memory array of claim 1, wherein each of the plurality of CAM devices is a standalone device.

6. A memory array comprising a plurality of content addressable memory (CAM) devices arranged in a plurality of rows, each CAM device storing a plurality of device-wide entries, wherein the memory array is to:
  obtain a search key;
  search the plurality of rows, row by row, for a matching device-wide entry corresponding to the search key; and
  upon finding the matching device-wide entry, output an address of the matching device-wide entry and stop searching the plurality of rows;
  wherein while searching a row in the plurality of rows, the memory array is further to:
    enable CAM devices in the row one by one in a decreasing order of a mismatch likelihood associated with each CAM device;
    determine for each enabled CAM device whether the enabled CAM device comprises the matching device-wide entry; and
    upon a determination that the enabled CAM device comprises the matching entry, stop searching the row.

7. The memory array of claim 6, wherein each CAM device in the memory array comprises a ternary content addressable memory (TCAM), wherein the plurality of rows are associated with a plurality of priorities, and wherein the memory array is to search plurality of rows in a decreasing order of priority.

8. The memory array of claim 1, wherein enabling CAM devices in the row one by one comprises enabling CAM devices in the row in a decreasing order of a mismatch likelihood associated with each CAM device in the row.

9. The memory array of claim 1, wherein the memory array is further to obtain a second search key and to search the plurality of rows, row by row, for a second matching device-wide entry corresponding to the second search key while searching the plurality of rows for the matching device-wide entry.

10. The memory array of claim 1, wherein each of the plurality of CAM devices is a standalone device.

11. A method for searching an array of content addressable memory (CAM) devices, where each device stores a plurality of entries, the method comprising:
  obtaining a search key from a processor;
  sequentially searching a first set of CAM devices in the array to determine whether the first set of CAM devices comprise a matching entry corresponding to the search key;
  upon a determination that the first set of CAM devices does not comprise the matching entry, sequentially searching a second set of CAM devices in the array to determine whether the second set of CAM devices comprise the matching entry; and
  upon a determination that the first set of CAM devices comprise the matching entry, outputting an address of the matching entry, without searching the second set of CAM devices,
  wherein while searching the first set or the second set of CAM devices, the method further comprises:
    enabling CAM devices in the first set or the second set one by one in a decreasing order of a mismatch likelihood associated with each CAM device;
    determining for each enabled CAM device in the first set or the second set whether the enabled CAM device in the first set or the second comprises at least a portion of the matching entry; and
    upon a determination that the enabled CAM device in the first set or the second set does not comprise at least a portion of the matching entry, stopping searching the first set or the second set.

12. The method of claim 11, wherein each CAM device in the array comprises a ternary content addressable memory (TCAM), and wherein first set of CAM devices are associated with a first priority and the second set of CAM devices are associated with a second priority, wherein the second priority is lower than the first priority.

13. The method of claim 11, wherein sequentially searching the first set of CAM devices comprises searching the first set of CAM devices in a decreasing order of a mismatch likelihood associated with each CAM device in the first set of CAM devices.

14. The method of claim 11, further comprising:
  obtaining a second search key from the processor; and
  searching the first set of CAM devices to determine whether the first set of CAM devices comprise a second matching entry corresponding to the second search key, while searching the first set of CAM devices to determine whether the first set of CAM devices comprise the matching entry corresponding to the search key.

15. The method of claim 11, wherein each CAM device in the array is a standalone device.

* * * * *